United States Patent
Pierreux et al.

(10) Patent No.: US 12,387,930 B2
(45) Date of Patent: Aug. 12, 2025

(54) METHOD AND WAFER PROCESSING FURNACE FOR FORMING AN EPITAXIAL STACK OF SEMICONDUCTOR EPITAXIAL LAYERS ON A PLURALITY OF SUBSTRATES

(71) Applicant: ASM IP Holding B.V., Almere (NL)

(72) Inventors: Dieter Pierreux, Pepingen (BE); Kelly Houben, Lubbeek (BE); Steven Van Aerde, Tielt-Winge (BE); Wilco Verweij, Nijkerk (BE); Bert Jongbloed, Oud-Heverlee (BE); Charles Dezelah, Helsinki (FI)

(73) Assignee: ASM IP Holding B.V., Almere (NL)

( * ) Notice: Subject to any disclaimer, the term of this patent is extended or adjusted under 35 U.S.C. 154(b) by 155 days.

(21) Appl. No.: 18/153,282

(22) Filed: Jan. 11, 2023

(65) Prior Publication Data

US 2023/0223258 A1 Jul. 13, 2023

Related U.S. Application Data

(60) Provisional application No. 63/299,184, filed on Jan. 13, 2022.

(51) Int. Cl.
*C30B 29/06* (2006.01)
*C30B 25/16* (2006.01)
(Continued)

(52) U.S. Cl.
CPC ........ *H01L 21/0262* (2013.01); *C30B 25/165* (2013.01); *C30B 25/186* (2013.01);
(Continued)

(58) Field of Classification Search
CPC ..... C30B 25/165; C30B 25/186; C30B 29/06; C30B 29/52; C30B 29/58; H01L 21/0262; H01L 21/02661; H01L 21/0257
See application file for complete search history.

(56) References Cited

U.S. PATENT DOCUMENTS 5,821,155 A * 10/1998 Izumi ................ H01L 21/02631
438/479
10,510,871 B1 12/2019 More
(Continued)

FOREIGN PATENT DOCUMENTS

EP 2005-112577 * 12/2005
WO WO-2005112577 A2 * 12/2005 ......... H01L 21/0245

Primary Examiner — Robert M Kunemund
(74) Attorney, Agent, or Firm — Banner & Witcoff, Ltd.

(57) ABSTRACT

A method and a wafer processing furnace for forming an epitaxial stack on a plurality of substrates is provided. In a preferred embodiment, the method comprises providing plurality of substrates to a process chamber. A plurality of deposition cycles are executed, thereby forming the epitaxial stack on the plurality of substrates. The epitaxial comprises a plurality of epitaxial pairs, each pair comprising a first epitaxial layer and a second epitaxial layer. The deposition cycle comprises a first deposition pulse and a second deposition pulse. The first deposition pulse comprises a provision of a first reaction gas mixture to the process chamber, thereby forming the first epitaxial layer and the second deposition pulse comprises a provision of a second reaction gas mixture to the process chamber, thereby forming the second epitaxial layer.

16 Claims, 3 Drawing Sheets

(51) Int. Cl.
  *C30B 25/18* (2006.01)
  *C30B 29/52* (2006.01)
  *C30B 29/68* (2006.01)
  *H01L 21/02* (2006.01)

(52) U.S. Cl.
  CPC .............. *C30B 29/06* (2013.01); *C30B 29/52* (2013.01); *C30B 29/68* (2013.01); *H01L 21/02532* (2013.01); *H01L 21/02661* (2013.01)

(56) References Cited

U.S. PATENT DOCUMENTS

| | | | |
|---|---|---|---|
| 2011/0003451 A1 | 1/2011 | Orlowski | |
| 2016/0049489 A1* | 2/2016 | Wan | H01L 29/66545 438/157 |
| 2021/0057570 A1 | 2/2021 | Lin | |
| 2021/0118679 A1* | 4/2021 | Barbosa Lima | H01L 21/02381 |
| 2021/0327704 A1* | 10/2021 | Kajbafvala | C23C 16/24 |

* cited by examiner

METHOD AND WAFER PROCESSING FURNACE FOR FORMING AN EPITAXIAL STACK OF SEMICONDUCTOR EPITAXIAL LAYERS ON A PLURALITY OF SUBSTRATES

TECHNICAL FIELD OF THE DISCLOSURE

The present disclosure relates to the field of semiconductor processing methods and apparatuses. More specifically, it relates to an integrated circuit manufacturing method and to a wafer processing furnace for forming an epitaxial stack of semiconductor epitaxial layers on a plurality of substrates.

BACKGROUND OF THE DISCLOSURE

Semiconductor industry keeps on moving forward in order to satisfy increasing demands by bringing forward new device architectures, device designs, materials and semiconductor processing methods. Besides, scaling may come as an additional option in an effort to keep pushing for more and cheaper chips. However, scaling has also started to reach its challenging borders In this aspect, within the field of memory devices and particularly relating to DRAMs, as scaling is slowing down, monolithic stacking has started to receive interest to realize the manufacturing of 3D DRAM devices. However, it may also come with its own challenges as monolithic stacking require making the DRAM capacitors even taller. Attempts have been made to realize the manufacturing of 3D DRAM devices. One of the well-known techniques used so far for this purpose is to stack multiple DRAM dies on top of each other. However, this may turn out to be a costly approach for some of the memory applications, while it may still be foreseen as a viable approach for other memory applications, such as for example, artificial intelligence.

There is, therefore, a need for improving the manufacturing of 3D DRAM devices. In addition, there is a particular need for improved deposition techniques and improved apparatuses to realize the manufacturing of 3D DRAM devices.

SUMMARY OF THE DISCLOSURE

It is an object of the present disclosure to provide improved methods for forming an epitaxial stack on a plurality of substrates and an improved wafer processing furnace. More particularly, certain embodiments may provide improved methods of thicker epitaxial stacks on the plurality of substrates. To at least partially achieve this goal, the present disclosure may provide a method and wafer processing furnace as defined in the independent claims. Further embodiments of the method and the wafer processing furnace are provided in the dependent claims In a first aspect, the present disclosure relates to a method for forming an epitaxial stack on a plurality of substrates. This method may comprise providing the plurality of substrates to a process chamber. A plurality of deposition cycles may be executed, thereby forming the epitaxial stack on the plurality of substrates. The epitaxial stack may comprise a plurality of epitaxial pairs. Each epitaxial pair may comprise a first epitaxial layer and a second epitaxial layer, the second epitaxial layer being different from the first epitaxial layer. A deposition cycle may comprise a first deposition pulse. This first deposition pulse may comprise a provision of a first reaction gas mixture to the process chamber, thereby forming the first epitaxial layer. The deposition cycle may comprise a second deposition pulse. The second deposition pulse may comprise a provision of a second reaction gas mixture to the process chamber, the second reaction gas mixture being different than the first reaction gas mixture, thereby forming the second epitaxial layer.

The inventive method according to the first aspect may allow for increasing throughput of the process, thanks to the provision of the epitaxial stack being carried out on a plurality of substrates as a result of a batch operation.

It may be an advantage of embodiments of the first aspect that plurality of epitaxial layers may be deposited on a plurality of substrates thanks to the plurality of deposition cycles. This may allow for forming thicker epitaxial layers on the plurality of substrates. This may further be advantageous in the manufacturing of semiconductor devices, particularly for 3D DRAM devices, in an effort to provide a remedy against the limits of planar scaling of these devices. This may further contribute to improving commercial success.

It may further be an advantage of embodiments of the first aspect that it may allow for providing an epitaxial stack, on a plurality of substrates, at lower process temperatures, thereby minimizing a probability of stress relaxation and/or uniformity problems that may be associated with the plurality of epitaxial layers that may be comprised in the epitaxial stack. This may further provide the advantage of providing improved commercial success.

It may be an advantage of embodiments of the first aspect that the execution of the plurality of deposition cycles may be performed substantially isothermal, thereby avoiding temperature ramp-ups and ramp-downs when forming the different epitaxial layers. This may further contribute to the increase in throughput of the process.

It may further be an advantage of embodiments of the first aspect that it may allow for reducing cost of semiconductor processing, thereby providing economic processing since plurality of substrates may be processed together in one and the same process run and in one and the same process chamber.

In a second aspect, the present disclosure relates to a wafer processing furnace configured to form an epitaxial stack of semiconductor epitaxial layers on a plurality of substrates according to embodiments of the first aspect of the present disclosure. The wafer processing furnace may comprise a process chamber extending in a vertical direction. It may also comprise a wafer boat for holding a plurality of substrates, wherein the plurality of substrates may be vertically spaced apart. It may further comprise a heater configured to heat the process chamber. A silane precursor storage module may be comprised in the wafer processing furnace. The silane precursor storage module may comprise at least one of a trisilane precursor, a mono silane precursor, a dissilane precursor, a tetrasilane precursor, a cyclohexasilane precursor and a neopentasilane precursor. A germane precursor storage module may be comprised in the wafer processing furnace. The germane precursor storage module may comprise at least one of a mono germane precursor, a germanium tetrachloride precursor. The wafer processing furnace may further comprise a gas providing manifold operationally connected to the silane precursor storage module and the germane precursor storage module. This gas providing manifold being further operationally connected to a gas injector. The gas injector may be arranged for injecting the one or more silane precursors and the one or more germane precursors.

It may be an advantage of embodiments of the second aspect that it allows for forming an epitaxial stack on a plurality of substrates, thereby increasing throughput of wafer processing.

It may also be a further advantage of embodiments of the second aspect that it may allow for reducing cost of semiconductor processing, thereby providing economic processing since plurality of substrates may be processed together in one and the same process run and in one and the same process chamber.

It may be an advantage of embodiments of the second aspect that it may allow for providing an epitaxial stack, on a plurality of substrates, at lower process temperatures, thereby minimizing a probability of stress relaxation and/or uniformity problems that may be associated with the plurality of epitaxial layers that may be comprised in the epitaxial stack. This may further provide the advantage of providing improved commercial success.

In a third aspect, the present disclosure relates to a use of trisilane as a semiconductor material precursor for forming a Si channel of a 3D DRAM memory device simultaneously on a plurality of substrates comprised in a single process chamber, at a temperature of at most 550° C., or in the range of 300° C. to 550° C., or in the range of 300° C. to 400° C., or in the range of 400° C. to 500° C., or in the range of 500° C. to 550° C. It shall be understood that temperatures as mentioned herein can be suitably measured by means of thermocouples being placed inside the process chamber.

It may be an advantage of the third aspect that it allows for forming the Si channels of 3D DRAM memory devices, thereby aiding the manufacturing of these devices in an effort to cope the drawbacks of the slow-down in scaling in the semiconductor industry. The fact that the Si channels can be formed on the plurality of substrates may provide the advantage of reducing manufacturing cost of these devices. It may further be an advantage that thanks to a higher order silane such as trisilane, Si channels may be formed at a temperature within a lower temperature range, thereby minimizing a probability of having stress relaxation.

The present concepts are believed to represent substantial new developments in this field. Departures from prior art practices are included in the present concepts that result in improved methods and improved wafer processing furnaces.

The above and other characteristics, features and advantages of the present disclosure will become apparent from the following detailed description and drawings. The drawings illustrate, by way of example, the principles of the disclosure. This description is given for the sake of example only, without limiting the scope of the disclosure. The reference figures referred to below relate to the drawings included.

Particular and preferred aspects of the disclosure are set out in the accompanying independent and dependent claims. Features from the dependent claims may be combined with features of the independent claims. Features from the dependent claims may be combined with features of other dependent claims as appropriate and not as just set out in the claims.

BRIEF DESCRIPTION OF THE FIGURES

The above, as well as additional objects, features and advantages of the present inventive concept, will be better understood through the following illustrative and non-limiting detailed description. Reference is also made to the drawings included. Like reference numbers will be used for like elements in the drawings unless stated otherwise

DETAILED DESCRIPTION OF THE DISCLOSURE

Figure 1A:
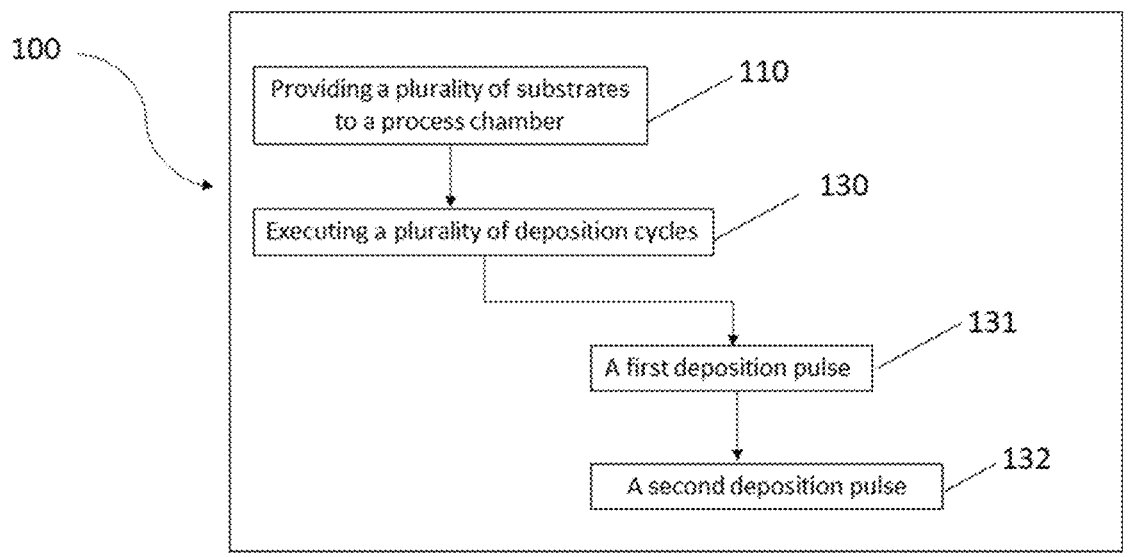
FIG. 1a and FIG. 1b: shows a flowchart of an exemplary method according to embodiments of the first aspect of the present disclosure.

The present disclosure will be described with respect to particular embodiments and with reference to certain drawings. However, the disclosure is not limited thereto but only by the claims. The drawings described are only schematic and are non-limiting. The dimensions do not correspond to actual reductions to practice the disclosure. The size of some of the elements may not be drawn to scale, in the drawings, for illustrative purposes.

The terms first, second, third and the like appearing in the description and the claims, are there to help in distinguishing between similar elements or similar features. Thus, they are not used necessarily for describing an order or a sequence in any manner. It is to be understood that such terms can be interchangeable under suitable conditions. It is thus, further to be understood that the embodiments of the disclosure described in the description are capable of being used in other sequences than the described ones.

It is to be noticed that the term "comprising", as used herein, should not be interpreted as being restricted to the means listed thereafter. It does not exclude other elements or steps. It is thus, to be interpreted as specifying the presence of the stated features, steps or components as referred to. However, it does not prevent one or more other steps, components, or features, or groups thereof from being present or being added.

Reference throughout the specification to "embodiments" in various places throughout the specification are not necessarily all referring to the same embodiment, but may. Furthermore, the particular features, structures or characteristics maybe combined in any suitable manner, as would be apparent to one of the ordinary skill in the art from the disclosure, in one or more embodiments.

Reference throughout the specification to "some embodiments" means that a particular structure, feature step described in connection with these embodiments is included in some of the embodiments of the present invention. Thus, phrases appearing such as "in some embodiments" in different places throughout the specification are not necessarily referring to the same collection of embodiments, but may.

It is to be noticed that the term "comprise substantially" used in the claims refers that further components than those specifically mentioned can, but not necessarily have to, be present, namely those not materially affecting the essential characteristics of the material, compound, or composition referred to.

It should be understood that in the description of exemplary embodiments of the disclosure, various features of the disclosure are sometimes grouped together in a single embodiment, figure or description in order to help to understand one or more of the inventive aspects. The claims following the detailed description are incorporated into the detailed description, with each claim standing on its own as a separate embodiment of the disclosure.

Some embodiments described herein include some but not other features included in other embodiments. However, combinations of features of different embodiments are meant to be within the scope of the disclosure, and form different embodiments, as would be understood by those in the art. In the claims included, any of the claimed embodiments can, for example, be used in any combination.

The following terms are provided solely to help in the understanding of the disclosure.

As used herein and unless provided otherwise, the term "uniformity problem" refers to one or more of the characteristics of the epitaxial stack that differs across the surface of each of the plurality of substrates such as, for example, thickness.

As used herein and unless provided otherwise, the term "substantially isothermal" refers to different depositions occurring within at most 50° C. difference from one another.

As used herein and unless provided otherwise, the term "intermittent provision" refers to the provision of a precursor not being steady, whereby the flow is interrupted by one or more stops or pauses in the flow.

As used herein and unless provided otherwise, the term "purge pulse" refers to the provision of an inert gas to the process chamber. In embodiments, the inert gas may comprise substantially at least one of $N_2$ and one or more noble gases. In alternative embodiments, the inert gas may comprise substantially one or more noble gases such as, for example, Ar, Kr, Ne, He or Xe.

As used herein and unless provided otherwise, the term "co-flow" refers to the simultaneous provision of more than one precursor to the process chamber.

As used herein and unless provided otherwise, the term "batch operation" refers to the processing of plurality of substrates at a time in a process chamber.

As used herein and unless provided otherwise, the term "a substantial temperature ramp-up or a substantial temperature ramp-down" refers to a temperature difference being in the range of 250° C. to 350° C. between two temperature changes.

As used herein and unless provided otherwise, the term "substrate warpage" refers to the difference between the maximum and minimum distances of a substrate, after processing, from a reference surface of the same substrate before processing.

As used herein and unless provided otherwise, the term "substrate bow" refers to the deviation of the center point of the median surface of the substrate after processing from a reference surface of the same substrate before processing.

The disclosure will now be described by a detailed description of several embodiments of the disclosure. It is clear that other embodiments of the disclosure can be configured according to the knowledge of persons skilled in the art without departing from the technical teaching of the disclosure, the disclosure being limited only by the terms of the appended claims.

A flowchart of an exemplary method according to embodiments of the first aspect of the present disclosure is presented in FIG. 1a.

This method (100) of forming an epitaxial stack on a plurality of substrates may comprise providing (110) the plurality of substrates to a process chamber.

In embodiments, the provision of the plurality of substrates may comprise loading the plurality of substrates in a wafer boat. The wafer boat may thus, be loaded in the process chamber. This process chamber may be extending in a longitudinal direction. This longitudinal direction may be a vertical direction or a horizontal direction.

In embodiments, this process chamber may be comprised in a vertical furnace. Therefore, this process chamber may be extending in a vertical direction. The vertical furnace may provide the advantage of saving cleanroom space compared to a horizontal furnace. The provision (110) of the plurality of substrates, on which the epitaxial stack is to be formed, may have the advantage of increasing throughput of the process since the formation of the epitaxial stack may be performed in the form of a batch operation. This increase in throughput of the process of forming the epitaxial stack on the plurality of substrates may also have an effect on increasing the overall throughput of the semiconductor manufacturing process. Thanks to the batch operation, wafer processing per unit time may be decreased. This may further be advantageous for reducing cost of semiconductor processing. The combination of a vertical furnace together with its capability of processing plurality of substrates may further provide economic processing since plurality of substrates may be processed together in one and the same process run and in one and the same process chamber, while saving cleanroom space.

The plurality of substrates may, in embodiments, comprise a semiconductor layer (10). This semiconductor layer (10) may, in embodiments, be a Si (111) layer or a Si (100) layer. The plurality of substrates may, in embodiments, be semiconductor substrates. The semiconductor substrates may, in embodiments, be Si (111) substrates or Si (100) substrates. In embodiments, one or more surface layers may be present or may be formed on the substrates.

Figure 2:
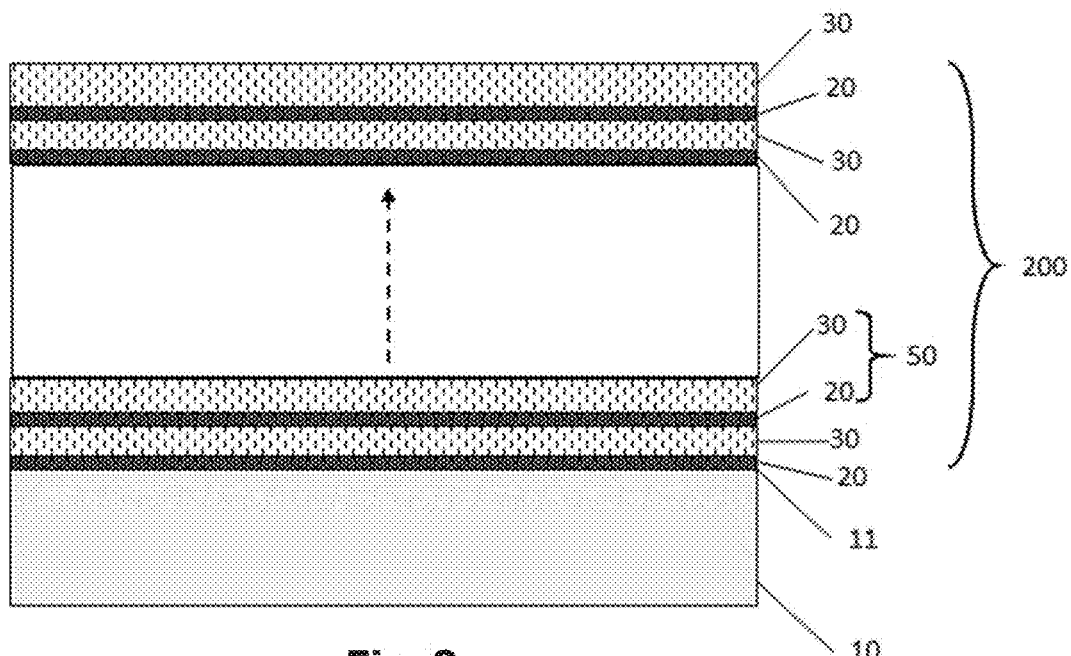
FIG. 2: is a schematic cross-section of the epitaxial stack according to embodiments of the first aspect of the present disclosure.

The method (100) may further comprise executing (130) a plurality of deposition cycles, thereby forming the epitaxial stack (200) on the plurality of substrates. This epitaxial stack (200) may comprise a plurality of epitaxial pairs (50). This epitaxial stack (200) is schematically represented in FIG. 2. Each epitaxial pair (50) may comprise a first epitaxial layer (20) and a second epitaxial layer (30), the second epitaxial layer (30) being different than the first epitaxial layer (20). In embodiments, the second epitaxial layer (30) may be overlaying the first epitaxial layer (20). In alternative embodiments, the second epitaxial layer (30) may be in direct contact with the first epitaxial layer (20). In embodiments, the first epitaxial layer (20) may be stacked alternatingly and repeatedly with the second epitaxial layer (30), thereby forming the epitaxial stack (200). A deposition cycle may comprise a first deposition pulse (131). This first deposition pulse (131) may comprise a provision of a first reaction gas mixture to the process chamber, thereby forming the first epitaxial layer (20). The deposition cycle may further comprise a second deposition pulse (132). This second deposition pulse (132) may comprise a provision of a second reaction gas mixture to the process chamber, thereby forming the second epitaxial layer (30). The second reaction gas mixture may be different from the first reaction gas mixture.

It may be an advantage of embodiments of this disclosure that thanks to the plurality of deposition cycles, plurality of epitaxial layers may be formed on a plurality of substrates. This may allow for forming thicker epitaxial layers on the plurality of substrates. This may further be advantageous in the manufacturing of semiconductor devices in an effort to provide a remedy against the limits of planar scaling of these devices, thus making them three-dimensional. This may particularly be advantageous for the manufacturing of 3D DRAM devices. The formation of thicker epitaxial layers on a plurality of substrates thanks to the present disclosure and the fact that it may open the route for three-dimensional manufacturing of semiconductor devices may further contribute to improving commercial success.

In embodiments, the number of the plurality of epitaxial pairs (50) may be at least 50. In embodiments, the number of the plurality of epitaxial pairs (50) may go up to 550, but not limited thereto. Therefore, in embodiments, the number of epitaxial pairs (50) may be at least from 50 to at most 150, or at least from 150 to at most 250 or at least from 250 to at most 350, or at least from 350 to at most 450 or at least from 450 to at most 550.

In embodiments, the first epitaxial layer (20) and the second epitaxial layer (30) may have the same thickness or a different thickness from one another.

In embodiments, at least one of the first epitaxial layer (20) or the second epitaxial layer (30) may have a thickness in the range of from at least 5 nm to at most 50 nm, or from at least 5 nm to at most 15 nm, or from at least 15 nm to at most 20 nm, or from at least 20 nm to at most 25 nm, or from at least 25 nm to at most 30 nm, or from at least 30 nm to at most 35 nm, or from at least 35 nm to at most 40 nm, or from at least 40 nm to at most 45 nm, or from at least 45 nm to at most 50 nm.

In embodiments, the epitaxial stack (200) may have a thickness of at least 5 µm. In embodiments, the thickness of the epitaxial stack (200) may go up to 11 µm, but not limited thereto. Therefore, in embodiments, the thickness of the epitaxial stack (200) may be at least from 5 µm to at most 7 µm, or at least from 7 µm to at most 9 µm, or at least from 9 µm to at most 11 µm. It may be an advantage that this epitaxial stack (200) can be formed on the plurality of substrates with reduced probability of stress relaxation. It may further be an advantage that this epitaxial stack (200) can be formed on the plurality of substrates with minimized uniformity issues.

In embodiments, the first epitaxial layer (20) may comprise a first semiconductor material and the provision of the first reaction gas mixture may comprise providing first semiconductor material precursors. In embodiments, the first semiconductor material precursors may comprise a germanium containing compound and may comprise a first silicon-containing compound. On the other hand, in embodiments, the second epitaxial layer (30) may comprise a second semiconductor material that may be different than the first semiconductor material. The provision of the second reaction gas mixture may comprise providing a second semiconductor material precursor. In embodiments, the second semiconductor material precursor may comprise substantially a second silicon-containing compound.

In embodiments, the provision of the first semiconductor material precursors may comprise providing the germanium containing compound and the first silicon-containing compound simultaneously into the process chamber. In other words, the germanium containing compound and the first silicon-containing compound may be co-flowed into the process chamber, thereby forming the first epitaxial layer (20).

In embodiments, the concentration of the germanium containing compound comprised in the first semiconductor material precursors may be supplied to the process chamber in range of 1 volume % to 100 volume %. In embodiments, the concentration of the germanium containing compound supplied to the process chamber may be at least from 1 volume % to at most 20 volume % or at least from 20 volume % to at most 40 volume % or at least from 40 volume % to at most 60 volume % or at least from 60 volume % to at most 80 volume % or at least from 80 volume % to at most 100 volume %.

In some embodiments, the concentration of the germanium containing compound comprised in the first semiconductor material precursors supplied to the process chamber may be 10 volume %.

The concentration of the germanium containing compound may further be adjusted, such as for example, it may be diluted by the use of an inert carrier gas. In other words, an inert gas may be provided in the process chamber. In embodiments, the inert gas may comprise substantially $N_2$. In some embodiments, the inert gas may comprise substantially of one or more noble gases such, for example, Ar, Xe, He, Ne and Kr. In some embodiments, the inert gas may comprise substantially of at least one of $N_2$ and one or more of noble gases.

In embodiments, the concentration of the first silicon-containing compound comprised in the first semiconductor material precursors may be supplied to the process chamber at 100 volume %. The adjustment of the concentration of the first silicon-containing compound comprised in the first semiconductor material precursors, may in some embodiments, be done optionally. This may, in these embodiments, be done by a provision of an inert gas in the process chamber. In embodiments, the inert gas may comprise substantially $N_2$. In some embodiments, the inert gas may comprise substantially of one or more noble gases such, for example, Ar, Xe, He, Ne and Kr. In some embodiments, the inert gas may comprise substantially of at least one of $N_2$ and one or more of noble gases.

Therefore, in embodiments, the provision of the first reaction gas mixture may comprise providing the germanium containing compound, to the process chamber, at a concentration in the range of 1 volume % to 100 volume % and providing the first silicon-containing compound, to the process chamber, at a concentration of 100 volume %.

In some embodiments, the provision of the first reaction gas mixture may comprise providing the germanium containing compound, to the process chamber, at a concentration of 10 volume % and providing the first silicon-containing compound, to the process chamber, at a concentration of 100 volume %.

In some embodiments, the provision of the first reaction gas mixture may further comprise a provision the inert gas with the provision of the first silicon-containing compound and/or the germanium-containing compound. In embodiments, the germanium containing compound comprised in the first semiconductor material precursors may be a germane. This germane may, in embodiments, be a mono germane ($GeH_4$) or a higher order germane. This higher order germane may be a di-germane ($Ge_2H_6$), a tri-germane ($Ge_3H_8$) or a tetra-germane ($Ge_4H_{10}$) as well as other higher order germanes having a general formula of $Ge_xH_{2x+2}$. In alternative embodiments, the germanium containing compound comprised in the first semiconductor material precursors may be a halo germane, having the formula $GeH_nX_{4-n}$, where X is a halogen such as, F, Cl, Br or I and where n is an integer from 0 to 3. Therefore, this halo germane may, in embodiments, be a fluoro-germane, a chloro-germane, a bromo-germane or an iodo-germane. The chloro-germane may, in embodiments, be chosen from $GeCl_3H$, $GeCl_4$, $GeClH_3$, $GeCl_2H_2$, and $Ge_2ClH_5$.

In embodiments, the germanium containing compound comprised in the first semiconductor material precursors may at least be one of $GeCl_4$ and $GeH_4$. In embodiments, the first silicon-containing compound comprised in the first semiconductor material precursors may be a silane, having a general molecular formula of $Si_nH_{2n+2}$, where n is an integer from at least 1 to at most 20. This silane may, in embodiments, be a mono silane ($SiH_4$). This silane, may in alternative embodiments, be a high order straight chain silane, having a general molecular formula of $Si_nH_{2n+2}$, where n is an integer from at least 2 to at most 20 such as, for example, disilane ($Si_2H_6$), trisilane ($Si_3H_8$), tetrasilane ($Si_4H_{10}$), pentasilane ($Si_5H_{12}$), hexasilane ($Si_6H_{14}$), heptasilane ($Si_7H_{16}$), octasilane ($Si_8H_{18}$), nonasilane ($Si_9H_{20}$), decasilane ($Si_{10}H_{22}$) or other high order straight chain silanes according to the general molecular formula of $Si_nH_{2n+2}$ and combinations thereof. In yet alternative embodiments, the first silicon-containing compound may be a combination of the mono silane and at least one of the high order straight chain silanes.

In embodiments, the first silicon-containing compound comprised in the first semiconductor material precursors may be trisilane.

The concentration of trisilane comprised in the first semiconductor material precursors may, in embodiments, be provided to the process chamber at 100 volume %. Optionally, the concentration of trisilane comprised in the first semiconductor material precursors, may in some embodiments, be adjusted when providing to the process chamber. Therefore, in these embodiments, an inert gas may be provided in the process chamber. In embodiments, the inert gas may comprise substantially $N_2$. In some embodiments, the inert gas may comprise substantially of one or more noble gases such, for example, Ar, Xe, He, Ne and Kr. In some embodiments, the inert gas may comprise substantially of at least one of $N_2$ and one or more of noble gases.

In embodiments, the second silicon-containing compound comprised substantially in the second semiconductor material precursor may be a silane, having a general molecular formula of $Si_nH_{2n+2}$, where n is an integer from at least 1 to at most 20. This silane may, in embodiments, be a mono silane ($SiH_4$). This silane, may in alternative embodiments, be a high order straight chain silane, having a general molecular formula of $Si_nH_{2n+2}$, where n is an integer from at least 2 to at most 20 such as, for example, a di-silane ($Si_2H_6$), a trisilane ($Si_3H_8$), a tetra-silane ($Si_4H_{10}$), a pentasilane ($Si_5H_{12}$), a hexasilane ($Si_6H_{14}$), a heptasilane ($Si_7H_{16}$), octasilane ($Si_8H_{18}$), nonasilane ($Si_9H_{20}$), decasilane ($Si_{10}H_{22}$) or other high order straight chain silanes according to the general molecular formula of $Si_nH_{2n+2}$ and combinations thereof. In yet alternative embodiments, the second silicon-containing compound may be a combination of the mono silane and at least one of the high order straight chain silanes. In embodiments, the concentration of the second silicon-containing compound comprised substantially in the second semiconductor material precursor, thereby forming the second epitaxial layer (30) may be provided to the process chamber at 100 volume %. The adjustment of the concentration of the second silicon-containing compound comprised substantially in the second semiconductor material precursor, may in some embodiments, be done optionally. Therefore, in these embodiments, an inert gas may be provided in the process chamber. In embodiments, the inert gas may comprise substantially $N_2$. In some embodiments, the inert gas may comprise substantially of one or more noble gases such, for example, Ar, Xe, He, Ne and Kr. In some embodiments, the inert gas may comprise substantially of at least one of $N_2$ and one or more of noble gases.

In embodiments, the second silicon-containing compound comprised substantially in the second semiconductor material precursor may be trisilane.

The concentration of trisilane comprised substantially in the second semiconductor material precursor may, in embodiments, be provided to the process chamber at 100 volume %. The adjustment of the concentration of trisilane comprised substantially in the second semiconductor material precursor, may in some embodiments, be done optionally. In these embodiments, an inert gas may be provided in the process chamber. In other words, in some embodiments, trisilane may be provided to the process chamber by means of an inert carrier gas. In embodiments, the inert gas may comprise substantially $N_2$. In some embodiments, the inert gas may comprise substantially of one or more noble gases such, for example, Ar, Xe, He, Ne and Kr. In some embodiments, the inert gas may comprise substantially of at least one of $N_2$ and one or more of noble gases. Therefore, in some embodiments, the second reaction gas mixture may be formed, whereby trisilane, being provided to the process chamber at a concentration of 100 volume %, is combined with the inert gas.

In embodiments, the provision of the first reaction gas mixture and the provision of the second reaction gas mixture may be done alternatingly, thereby forming the epitaxial layers (20, 30) of the plurality of the epitaxial pairs (50) comprised in the epitaxial stack (200). In other words, while the provision of the first silicon-containing compound and the germanium-containing compound comprised in the first semiconductor material precursors lead to the formation of the first epitaxial layer (20) comprising the first semiconductor material, the provision of the second silicon-containing compound substantially comprised in the second semiconductor material precursor leads to the formation of the second epitaxial layer (30) comprising the second semiconductor material.

In some embodiments, the first silicon-containing compound and the second silicon containing compound may be different from each other.

In these embodiments, switching from the formation of the first epitaxial layer (20) to the formation of the second epitaxial layer (30) may be configured such that the provision of the germanium-containing compound may be stopped after forming the first epitaxial layer (20) and the second silicon-containing compound may be provided gradually into the process chamber. During this gradual provision of the second silicon-containing compound into the process chamber, the provision of first silicon-containing compound may, in some embodiments, be continued, thereby co-flowing both the first silicon-containing compound and the second silicon-containing compound into the process chamber, while in other embodiments, the provision of the first silicon-containing compound may gradually be stopped.

In alternative embodiments, switching from the formation of the first epitaxial layer (20) to the formation of the second epitaxial layer (30) may be configured such that both the provision of the first silicon-containing compound and the provision of the germanium-containing compound may be stopped after forming the first epitaxial layer (20). The formation of the second epitaxial layer (30) may then be started by the provision of the second silicon-containing compound.

Still in these embodiments, switching from the formation of the second epitaxial layer (30) to the formation of the first epitaxial layer (20) may be configured such that the provision of the second silicon-containing compound may be stopped after forming the second epitaxial layer (30) and the first silicon-containing compound may be provided together with the germanium-containing compound into the process chamber, thereby forming the first epitaxial layer (20).

Still in these embodiments, where the first silicon-containing compound and the second-silicon containing compound may be different from one another, the provision of the first silicon-containing compound and the provision of the germanium-containing compound as comprised in the first reaction gas mixture, forms the first epitaxial layer (20). After formation of the first epitaxial layer (20), the provision of the germanium-containing compound may be stopped. The formation of the second epitaxial layer (30) may then be carried out by the provision of the second silicon-containing compound as comprised in the second reaction gas mixture, whereby the flow of the first silicon-containing compound may still be maintained.

In an exemplary embodiment, mono silane and mono germane, as comprised in the first reaction gas mixture, may be used to form the first epitaxial layer (20). The provision of the mono germane may be stopped upon formation of the first epitaxial layer (20). The provision of mono silane may still be maintained during the provision of the second reaction gas mixture for forming the second epitaxial layer (30), whereby the second reaction gas mixture may comprise the provision of trisilane. A temperature ramp down that may be executed to bring the temperature in the process chamber, during the formation of the second epitaxial layer (30) to a lower temperature value than that of the one used for the formation of the first epitaxial layer (20). This may then allow for forming the second epitaxial layer (30), at this lower temperature, mainly due the provision of the trisilane comprised in the second reaction gas mixture.

A purge pulse may, in some embodiments, be applied when switching from the formation of the first epitaxial layer (20) to the formation of the second epitaxial layer (30) or when switching from the formation of the second epitaxial layer (30) to the formation of the first epitaxial layer (20).

In embodiments, the formation of the epitaxial stack (200) on the plurality of substrates may start either with the formation of the first epitaxial layer (20) or with the formation of the second epitaxial layer (30) of the first epitaxial pair (50). Therefore, while in some embodiments, the epitaxial layer being in contact with a surface of the plurality of substrates may be the first epitaxial layer (20), in other embodiments, it may be the second epitaxial layer (30). Thus, in embodiments, the first epitaxial layer (20) or the second epitaxial layer (30) comprised in the first epitaxial pair (50) may be formed in direct contact with the surface of the plurality of substrates.

High order silanes have the advantage of providing a lower temperature epitaxial layer formation. This is thanks to the presence of the low energy Si—Si bonds. The lower temperature epitaxial layer formation that trisilane can offer may therefore, provide the advantage of alleviating the problem of stress relaxation since the growth rate will be lower. Furthermore, the provision of the first silicon-containing compound comprised in the first semiconductor material precursors and the provision of the second silicon-containing compound comprised substantially in the second semiconductor material precursor both being trisilane may offer the advantage of carrying out the formation of the epitaxial stack with minimum usage of precursors. In other words, the formation of the epitaxial stack (200) comprising the plurality of epitaxial pairs (50), may be carried out by using trisilane and at least one of a halogermane such as GeCl$_4$ and a germane such as GeH$_4$ to make up the first epitaxial layer (20) and the second epitaxial layer (30). Formation of the epitaxial stack (200) with minimum usage of precursors may offer the advantage of lowering processing costs. It may also help to reduce the complexity of epitaxial stack formation as fewer number of precursors are involved.

In embodiments, the first deposition pulse (131) may be carried out at a first deposition temperature and the second deposition pulse (132) may be carried out at a second deposition temperature. The first and the second deposition temperature may differ at most 50° C. The measurement of deposition temperature may, in embodiments, be carried out by using a thermocouple, that is placed inside the process chamber. The thermocouple may be situated in an upper section of the process chamber and above an upper section of the wafer boat holding the plurality of substrates. In some embodiments, a plurality of thermocouples may be used. Each of the plurality of thermocouples may be placed at differing locations inside the process chamber for allowing a better temperature control inside the process chamber.

In embodiments, the temperature difference between an upper section of the process chamber and a lower section of the process chamber, during the first deposition and/or the second deposition may be about 2° C. or 3° C. It is to be understood that the upper section and the lower section of the process chamber may correspond to the neighborhood of the upper and lower portion of the wafer boat holding the plurality of substrates.

The formation of an epitaxial stack (200) having different epitaxial layers may involve carrying out different deposition pulses at different temperatures. This may be due to differing chemical nature of the epitaxial layers to be formed. This may however, require the performing of temperature ramp-ups and temperature ramp-downs each time a different epitaxial layer (20, 30) of the epitaxial stack (200) is to be formed. These temperature ramp-ups and temperature ramp-downs are typically repeated plurality of times when forming a thicker epitaxial stack. Furthermore, temperature ramp-ups and temperature ramp-downs having a larger difference than 50° C. may have adverse effects on the stress level of the epitaxial layers. This may lead to problems, such as for example, delamination, cracking or buckling of the one or more of the epitaxial layers. In embodiments of the present disclosure, having a difference of at most 50° C. may have the advantage of easier execution of such temperature ramp-ups and temperature ramp-downs. A lower temperature difference between temperature ramp-ups and temperature ramp-downs may also be advantageous in terms of the throughput of the processing as the required temperature can be achieved in a shorter period of time in between depositions of different epitaxial layers. Besides, this temperature difference of at most 50° C. that may exist between the first deposition (131) pulse and the second deposition pulse (132) may help to reduce the stabilization time in the process chamber. Stabilization time is the time needed such that the temperature attained in the process chamber after a temperature ramp-up or temperature ramp-down is stabilized.

In embodiments, the formation of the first epitaxial layer (20) and the formation of the second epitaxial layer (30) may be done in the same process chamber.

In embodiments, the process chamber may be maintained at a pressure less than 10 Torr during the formation of the epitaxial stack.

In some embodiments, the process chamber may be maintained at a pressure less than 2 Torr. In some embodiments, this pressure may be less than 1 Torr. This pressure may, in some embodiments, be less than 500 mTorr. In some embodiments, this pressure may be within a range from about 200 mTorr to about 500 mTorr. In some embodiments, this pressure may be within a range from about 200 mTorr to about 1 Torr.

In embodiments, both the first and the second deposition temperature may be less than 600° C. In embodiments, both the first and the second deposition temperature may be at a temperature in the range of from at least 300° C. to at most 600° C., or from at least 300° C. to at most 350° C., or from at least 350° C. to at most 400° C. or from at least 400° C. to at most 450° C. or from at least 450° C. to at most 500° C. or from at least 500° C. to at most 550° C. or from at least 550° C. to at most 600° C. Formation of the first (20) and the second epitaxial layer (30) at a temperature in the range of 300° C. to 600° C. may be advantageous as it may lead to a minimized probability of having stress relaxation of the epitaxial layers as the thickness of the epitaxial stack is being increased. Furthermore, it may provide the advantage of reducing uniformity issues across the wafer in terms of such as, for example, thickness non-uniformity.

In embodiments, both the first deposition temperature and the second deposition temperature may be at a temperature in the range of 300° C. to 600° C. Formation of the first epitaxial layer (20) and formation of the second epitaxial layer (30) within this lower temperature range may provide the advantage of reducing the probability of stress relaxation in the epitaxial stack (200), while providing an acceptable growth rate for the epitaxial layers (20, 30).

In embodiments, both the first deposition temperature and the second deposition temperature may be at a temperature in the range of from at least 300° C. to at most 350° C. or from at least 350° C. to at most 400° C. or from at least 400° C. to at most 450° C. or from at least 450° C. to at most 550° C. or from at least 500° C. to at most 550° C. or from at least 550° C. to at most 600° C.

The first deposition pulse and the second deposition pulse may be configured within this temperature range such that both the formation of the first epitaxial layer (20) and the formation of the second epitaxial layer (30) can be done substantially isothermal. Formation of different epitaxial layers (20,30) under substantially isothermal conditions may provide the advantage of avoiding temperature ramp-ups and temperature ramp-downs during their formation. This may, in turn, lead to an increase in throughput of the epitaxial process since the rate of production can be increased. This may be due to the fact that part of process time which would otherwise be dedicated to the temperature ramp-ups and temperature ramp-downs, including the time for stabilization after reaching the desired temperature, can then be saved. Partial pressure of the first silicon-containing compound and/or the second silicon containing compound may be adjusted such that the growth rate of the first epitaxial layer (20) and/or the second epitaxial layer (30) obtained under substantially isothermal conditions can further be increased.

Furthermore, both depositions may advantageously be performed in one and the same process chamber under substantially isothermal conditions, thereby avoiding transfer between different process chambers.

In embodiments, both the first deposition temperature and the second deposition temperature may be at a temperature in the range of 450° C. to 550° C. In embodiments, both the first deposition temperature and the second deposition temperature may be at a temperature in the range of from at least 450° C. to at most 500° C. or from at least 500° C. to at most 550° C. Performing both the first deposition and the second deposition in this narrow temperature range may provide the advantage of forming the first epitaxial layer (20) and the second epitaxial layer (30) substantially isothermal.

In some embodiments, both the first deposition temperature and the second deposition temperature may be at a temperature in the range of 480° C. to 520° C.

In these embodiments, the first silicon-containing compound comprised in the first semiconductor material precursors may be a mono silane or a high order straight chain silane and the germanium-containing compound comprised in the first semiconductor material precursors may be a mono germane or a halo germane. This halo germane may in these embodiments be $GeCl_4$. The second silicon-containing compound comprised substantially in these embodiments may also be a mono silane or a high order straight chain silane.

Figure 3:
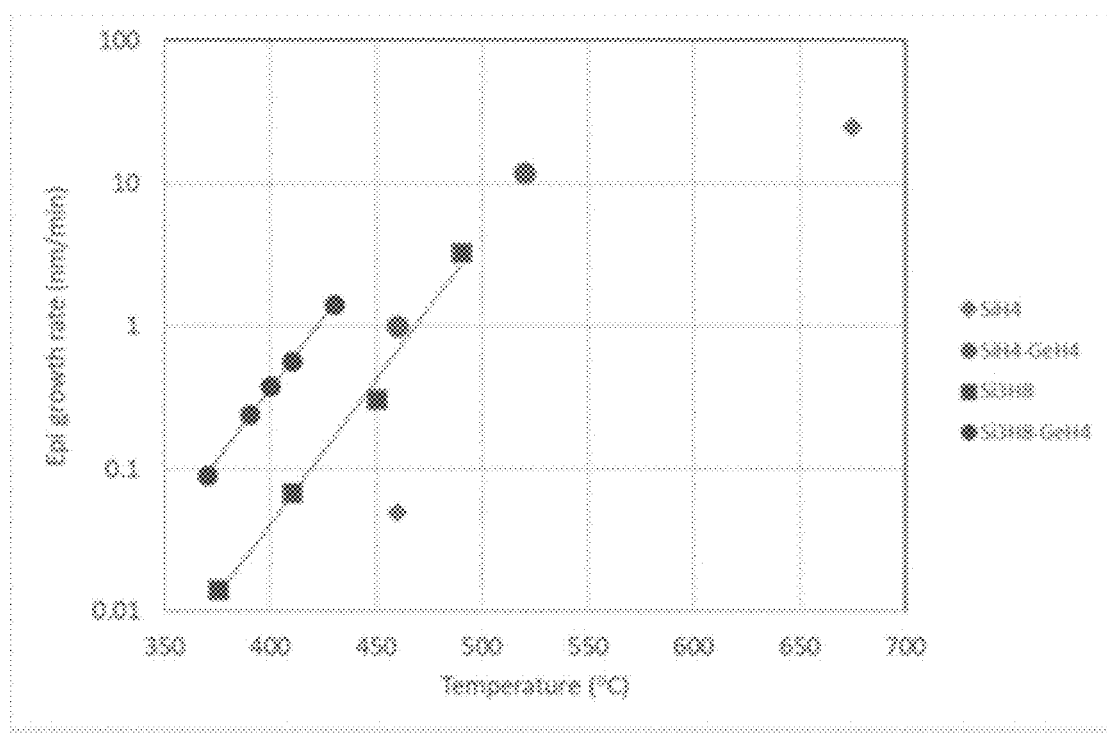
FIG. 3: is graph showing growth (nm/min.) rate vs. temperature (° C.)

In exemplary embodiments, where the second silicon-containing compound comprised substantially in the second semiconductor material precursor is trisilane, thereby forming the second epitaxial layer (30) (full squares), and where the first silicon-containing compound comprised in the first semiconductor material precursors is mono silane and where the germanium containing compound comprised in the first semiconductor material precursors is $GeH_4$, thereby forming the first epitaxial layer (20) (lighter colored full circles), formation of both epitaxial layers (20,30) may be carried out at a temperature in the range of 450° C. and 500° C., thereby being substantially isothermal as exemplified in FIG. 3. Forming both epitaxial layers (20, 30) substantially isothermal provides a viable growth rate being in between 1 to 10 nm/min for both epitaxial layers C Furthermore, this lower temperature epitaxial layer formation, may provide the advantage of reduced probability for stress relaxation in the epitaxial stack formed, particularly when thickness of the epitaxial stack (200) is increased.

In other exemplary embodiments, where the second silicon-containing compound comprised substantially in the second semiconductor material precursor is trisilane, thereby forming the second epitaxial layer (30) (full squares), and where the first silicon-containing compound comprised in the first semiconductor material precursors is trisilane and where the germanium containing compound comprised in the first semiconductor material precursors is $GeH_4$, thereby forming the first epitaxial layer (20) (darker colored full circles), formation of both epitaxial layers (20,30) may also be carried out at a temperature in the range of 400° C. and 450° C., thereby being substantially isothermal as exemplified in FIG. 3. These epitaxial layers have a growth rate in the range of 0.08 to 1.2 nm/min.

In yet other exemplary embodiments, where the second silicon-containing compound comprised substantially in the second semiconductor material precursor is mono silane, thereby forming the second epitaxial layer (30) (light colored diamond), and where the first silicon-containing compound comprised in the first semiconductor material precursors is mono silane and where the germanium containing compound comprised in the first semiconductor material precursors is $GeH_4$, thereby forming the first epitaxial layer (20) (lighter colored full circles), formation of both epitaxial layers (20,30) may also be carried out at a temperature in the range of 450° C. and 500° C., thereby being substantially isothermal as exemplified in FIG. 3. These epitaxial layers have a growth rate in the range of 0.08 to 1.0 nm/min.

In embodiments, the first silicon-containing compound comprised in the first semiconductor material precursors may be a cyclic silane or a high order branched silane and the germanium containing compound comprised in the first semiconductor material precursors may be a germane. In these embodiments, this germane may be $GeH_4$.

The cyclic silane or in other words, the cyclic silane has a general molecular formula of $Si_nH_{2n}$, where n is an integer from at least 3 to at most 20, and it is a silane with a ring structure. In some embodiments, the cyclic silane has one or more silyl substituents.

In embodiments, the cyclic silane may be a cyclohexasilane. Cyclohexasilane is a high order silane, however it has a ring structure, thereby having lower Si—Si and Si—H bond strengths. This may therefore provide the advantage of forming epitaxial layers at lower deposition temperatures. Other cyclic silanes that may be used include cyclotrisilane ($Si_3H_6$), cyclotetrasilane ($Si_4H_8$), cyclopentasilane ($Si_5H_{10}$), cyclohexasilane ($Si_6H_{12}$), cycloheptasilane ($Si_7H_{14}$) or combinations thereof. Silyl substituted cyclic silanes may, in some embodiments, be used including silyl cyclotetrasilane, 1,2-disilylcyclopentasilane, 1,3-disilylcyclohexasilane, silylhexasilane and combinations thereof.

High order branched silanes have a general formula $Si_nH_{2n+2}$, where n is an integer from at least 4 to at most 20.

The high order branched silane may, in embodiments, be neopentasilane.

In alternative embodiments, other high order branched silanes that can be used may include 2-silylpentasilane, 2,2-disilyltetrasilane, 2-silyltrisilane, 2-silyltetrasilane, 3-silylpentasilane, 2,2-disilyltrisilane, 2,3-disilylpentasilane, 2,2,3-trisilylpentasilane, 2,3,4-trisilylpentasilane, 2,3,4-trisilylpentasilane, 2,3-disilyltetrasilane, 2,2,3,3-tetrasilyltetrasilane, 2-silylhexasilane, 3-silylhexasilane, 3,4-disilylhexasilane, 2,3-disilylpentasilane, 2,4-disilylhexasilane, 4-silylheptasilane, 2,2-disilylpentasilane, 3,3-disilylpentasilane, 3,3-disilylhexasilane, 2,2-disilyhexasilane, 2,3-disilylhexsilane, 2-silylheptasilane, 3-silylheptasilane, 2,5-disilyhexasilane, 2,3,3-trisilylpentasilane and combinations thereof.

In embodiments, both the first and the second deposition temperature may be at a temperature in the range of 300° C. to 500° C., when the first silicon-containing compound comprised in the first semiconductor material precursors is a cyclic silane or a high order branched silane and when the germanium-containing compound comprised in the first semiconductor material precursors is $GeH_4$. The temperature may, in these embodiments, be in a range from at least 300° C. to at most 350° C. or from at least 350° C. to at most 400° C. or from at least 400° C. to at most 450° C. or from at least 450° C. to at most 500° C. In these embodiments, the cyclic silane may be cyclohexasilane and the high order branched silane may be neopentasilane.

The cyclic silane or the high order branched silane may, in these embodiments, also be provided as the second silicon-containing compound comprised substantially in the second semiconductor material precursor. The cyclic silane comprised substantially comprised substantially in the second semiconductor material precursor may, in these embodiments, then be cyclohexasilane. The high order branched silane comprised substantially in the second semiconductor material precursor may, in these embodiments, also be neopentasilane. In this way, the formation of the epitaxial pairs (50) comprising the first (20) and the second (30) epitaxial layer may be carried out substantially isothermal. This may provide the advantage of avoiding temperature ramp-ups and temperature ramp-downs when switching from the formation of the first epitaxial layer (20) to the formation of the second epitaxial layer (30). This may, in turn, lead to an increase in throughput of the epitaxial process since the rate of production can be increased. This may be due to the fact that part of process time which would otherwise be dedicated to the temperature ramp-ups and temperature ramp-downs can then be minimized.

In embodiments, the first silicon-containing compound and the second silicon containing compound may be the same. This may be advantageous as it reduces the number of precursors used for the formation of the first (20) and the second epitaxial layer (30). This may then further provide the advantage of reducing processing cost as the number of precursors is reduced.

Thus, in embodiments, both the first and the second deposition temperature may be at a temperature in the range of 300° C. to 550° C.

In these embodiments, the first silicon-containing compound may be provided in a continuous flow and the germanium-containing compound may be provided intermittently. Provision of the first silicon-containing compound in a continuous flow may, in other words, imply that it is provided during the first deposition pulse and during the second deposition pulse. Accordingly, intermittent provision of the germanium-containing compound, may in other words, imply it being provided only during the first deposition pulse. The fact that the germanium-containing compound is to be provided intermittently while the first silicon-containing compound is being provided in a continuous flow may provide the advantage of reducing the number of purge pulses. This may be due to the fact that the intermittent provision of the germanium-containing compound is leading to the formation of the first epitaxial layer (20) when it is provided and leading to the formation of the second epitaxial layer (30) when it is stopped and may thus, eliminate the need for providing a purge pulse when switching between the formation of the different epitaxial layers (20,30) during the formation of the epitaxial stack (200).

A purge pulse, may nevertheless be provided in some embodiments. This may lead to obtaining a sharper interface between the epitaxial layers (20, 30). In other words, providing a purge pulse may provide a clear distinction when transitioning between the first epitaxial layer (20) and the second epitaxial layer (30) in the epitaxial stack (200). The purge pulse may, in these embodiments, be applied when switching from the formation of the first epitaxial layer (20) to the formation of the second epitaxial layer (30) or when switching from the formation of the second epitaxial layer (30) to the formation of the first epitaxial layer (20).

In exemplary embodiments, the first and second silicon-containing compound may be trisilane. In other exemplary embodiments, the first and second silicon-containing compound may be cyclohexasilane. In yet further exemplary embodiments, the first and second silicon-containing compound may be neopentasilane. Thus, in these embodiments, trisilane, cyclohexasilane or neopentasilane may be provided in a continuous flow, while the germanium-containing compound may be provided intermittently.

In embodiments, the germanium-containing compound comprised in the first semiconductor material precursors may be mono germane ($GeH_4$) and the first silicon-containing compound comprised in the first semiconductor material precursors may be mono silane ($SiH_4$).

It is to be understood that the flow rates of the precursor gases may be adjusted to tune their partial pressure inside the process chamber. This may help to adjust the concentration of each of the precursor gases in the process chamber. This may then allow for determining the growth rate of the epitaxial layers. Furthermore, it may allow for determining the atomic percentage of germanium in the first epitaxial layer (20).

In embodiments, each one of the first epitaxial layers (20) of the epitaxial stack (200) may be formed with a germanium concentration from at least 10 atomic % to at most 30 atomic % or from at least 10 atomic % to at most 15 atomic % or from at least 15 atomic % to at most 20 atomic % or at least from 20 atomic % to at most 25 atomic % or at least from 25 atomic % to at most 30 atomic % and with a silicon concentration from at least 70 atomic % to at most 90 atomic % or from at least 70 atomic % to at most 75 atomic % or from at least 75 atomic % to at most 80 atomic % or from at least 80 atomic % to at most 85 atomic % or from at least 85 atomic % to at most 90 atomic %.

Figure 1B:
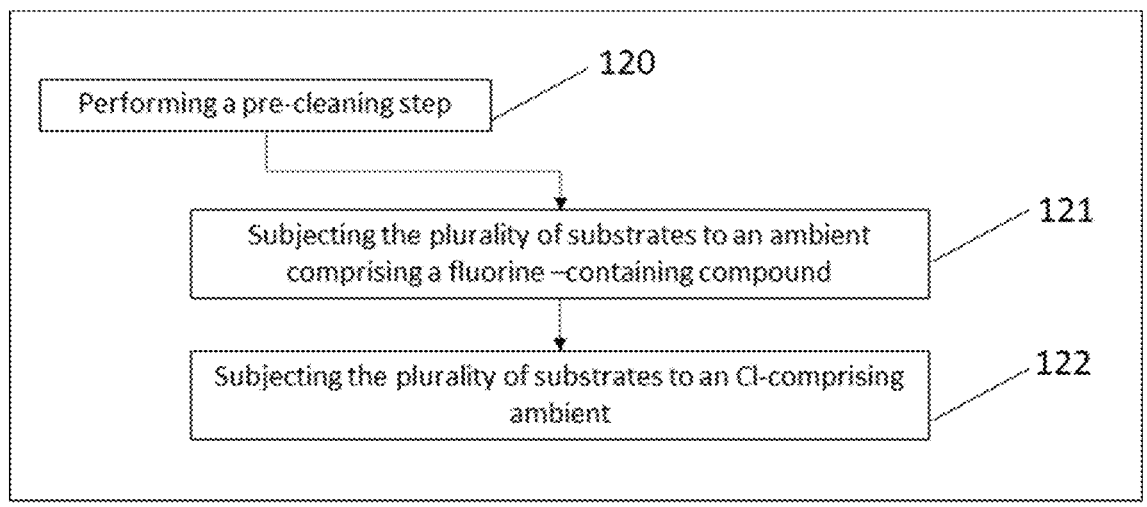

The presence of germanium in the first epitaxial layer (20) may have the advantage of providing etch selectivity towards the second epitaxial layer (30). The concentration of germanium being in the range of 15 atomic % to 30 atomic % may further provide the advantage of minimizing a probability of stress relaxation in the epitaxial stack. In embodiments, it may be advantageous to perform a pre-cleaning step (120) before executing the plurality of deposition cycles (130). This pre-cleaning step is schematically represented in FIG. 1b. This may help to get rid of surface contamination from the plurality of substrates on which the epitaxial stack (200) is to be formed and/or to clean the surface native oxide that may be present. This native oxide may in embodiments be a silicon oxide. This pre-cleaning step (120) may, in embodiments, be performed in the same process chamber where the formation of the epitaxial stack takes (200) place. In alternative embodiments, this pre-cleaning step may take place in another chamber comprised in the same wafer processing apparatus as that of the process chamber.

In embodiments, the pre-cleaning step (120) that may be performed before executing the plurality of deposition cycles (130) may comprise subjecting (121) the plurality of substrates to an ambient comprising a fluorine compound. This fluorine comprising ambient may, in embodiments, be a gaseous ambient. Thus, in embodiments, the plurality of substrates may be subjected to the gaseous ambient comprising the fluorine compound. This fluorine compound may, in embodiments, be HF, $NF_3$, F2, $SF_6$, $ClF_3$ or $CF_4$. Even though this pre-cleaning step may help to get rid of surface contamination and especially surface native oxide, there may still be a need to remove remaining oxygen atoms from the plurality of substrates before forming the epitaxial stack (200). This may require an additional cleaning step to achieve this. This additional cleaning step typically involves subjecting the plurality of wafers to a gaseous ambient comprising $H_2$. This exposure is typically done at a temperature around 800° C. This treatment is above the epitaxial deposition temperature, and may therefore require a substantial temperature ramp-down before the formation of the epitaxial stack (200) can start. Additionally, such a high temperature exposure may run the risk of damages to occur such as, for example, in the form of cracking of the coating of the tubes, the liner of the process chamber or the wafer boat. It may therefore, be advantageous to configure this additional cleaning step such that a substantial temperature ramp down is avoided after completion of this additional cleaning step and before being able to form the epitaxial stack (200) so that damage to the coating of the tubes, the liner or the wafer boat is reduced. Therefore, the pre-cleaning step (120) may, in embodiments, further comprise a step (122) of subjecting the plurality of substrates to a Cl comprising ambient at a temperature in the range of 400° C.-600° C. after subjecting the plurality of substrates to the ambient comprising the fluorine-containing compound (121).

The step (122) of subjecting the plurality of substrates to the Cl comprising ambient at a temperature in the range of 400° C.-600° C. is therefore performed as a replacement of the typical exposure to the gaseous ambient comprising $H_2$ done at around 800° C. This may provide the advantage of minimizing thermal stress on the coating of the tubes, the liner of the process chamber or the wafer boat, thereby reducing the risk of cracking of the coating. Furthermore, a substantial temperature ramp-down with a higher temperature difference with that of the formation of the epitaxial layers (20,30) of the epitaxial stack (200) may be avoided, as the formation of the epitaxial layers (20, 30) of the epitaxial stack (200) may to be carried out between 300° C.-550° C. This may provide additional advantage of easier control of thermal budget in the process chamber. It may further be advantageous in improving the throughput of the epitaxy process as process time can be shortened since longer temperature ramp-up times or longer temperature ramp-down times will be overcome.

In embodiments, the step of subjecting the plurality of substrates to the Cl comprising ambient may be at a temperature from at least 400° C. to at most 450° C. or from at least 450° C. to at most 500° C. or from at least 500° C. to at most 550° C. or from at least 550° C. to at most 600° C.

The Cl comprising ambient may, in embodiments, comprise HCl or $Cl_2$ gas.

In embodiments, the epitaxial stack (200) may be formed on a single side of the plurality of substrates. That side on which the epitaxial stack (200) is to be formed may be an upper side of each of the plurality of substrates, the upper side being opposite to a lower side. When arranged in the wafer boat, the upper side of each substrate faces the lower side of the other substrate, which is placed over it in the vertical direction in the wafer boat.

Therefore, in these embodiments, the pre-cleaning step (120) that may be performed before executing the plurality of deposition cycles (130) may comprise subjecting the upper sides of the plurality of substrates to the ambient comprising the fluorine compound. The pre-cleaning step may further comprise the step of subjecting the upper sides of the plurality of substrates to the Cl comprising ambient at a temperature in the range of 400° C.-600° C. after subjecting the upper sides of the plurality of substrates to the ambient comprising the fluorine-containing compound, where the Cl comprising ambient may comprise HCl or $Cl_2$ gas.

In alternative embodiments, the epitaxial stack (200) may be formed on both sides of the plurality of substrates, such as for example, both on the upper side and on the lower side.

Thus, in embodiments, the pre-cleaning step (120) that may be performed before executing the plurality of deposition cycles (130) may comprise subjecting both sides of the plurality of substrates to the ambient comprising the fluorine compound. Furthermore, similar to the additional cleaning step comprised in the pre-cleaning step (120) used for treating the upper side of the plurality of substrates the pre-cleaning step (120) may, in embodiments, comprise a step of subjecting both sides of the plurality of substrates to the Cl comprising ambient at a temperature in the range of 400° C.-600° C. after subjecting both sides of the plurality of to the ambient comprising the fluorine-containing compound, where the Cl comprising ambient may comprise HCl or $Cl_2$ gas. Forming the epitaxial stack (200) on both sides of the plurality of substrates may have the advantage of equilibrating the stress on the upper side and lower side of each of the plurality of substrates. This way a possibility of having wafer bow or wafer warpage may at least be minimized.

After performing the pre-cleaning step (120) that may comprise subjecting (122) both sides of the plurality of substrates to the fluorine containing compound and to the Cl comprising ambient, the plurality of substrates may be ready for the formation of the first epitaxial layer (20). Thus, in embodiments, the formation (131) of the first epitaxial layer (20) may comprise forming the first epitaxial layer (20) on both sides of the plurality of substrates. The formation of the epitaxial stack (200) comprising the epitaxial pairs (50) may continue further on both sides of the plurality if substrates.

Uniformity in terms of thickness of the epitaxial stack (200) across the surface of each of the plurality of substrates may be one of the important criteria to be accomplished. This is due to the fact that non-uniform thickness across the surface, where the epitaxial stack (200) is formed, may lead to the presence of topography on the surface. This may further challenge or even jeopardize the following processing steps, which in turn may undesirably increase manufacturing cost. The thickness uniformity may be such that there can be an increase in thickness of the epitaxial layers going from the center towards the edges of the substrates.

In order to alleviate this problem, at least one of the first reaction gas mixture and the second reaction gas mixture may, in embodiments, comprise an etchant gas. Therefore, in embodiments, the provision of the first reaction gas mixture may comprise providing the first semiconductor material precursors and may also comprise the provision of the etchant gas. In other words, the first semiconductor material precursors and the etchant gas may be provided under co-flow to the process chamber. Similarly, in embodiments, the provision of the second reaction gas mixture may comprise providing the second semiconductor material precursor and may also comprise the provision of the etchant gas. In other words, the second semiconductor material precursor and the etchant gas may be provided under co-flow to the process chamber. The reactivity of the etchant gas may depend on its flow rate, its composition, its partial pressure in the first or in the second reaction gas mixture, the temperature at which the first or the second reaction gas mixture is provided in the process chamber.

In embodiments, the etchant gas may comprise at least one of Cl or F. In embodiments, the etchant gas may be HCl, $F_2$, HF, $SF_6$, $ClF_3$, $NF_3$, $Cl_2$ or $CF_4$.

In embodiments, the flow rate of the etchant gas may be less than 20 sccm. The etchant gas may, in embodiments, be provided to the process chamber in the presence of a carrier gas. The concentration of the etchant gas may thus, be diluted. In embodiments, the inert gas may comprise substantially $N_2$. In some embodiments, the inert gas may comprise substantially of one or more noble gases such, for example, Ar, Xe, He, Ne and Kr. In some embodiments, the inert gas may comprise substantially of at least one of $N_2$ and one or more of noble gases. In these embodiments, the etchant gas may have a partial pressure of less than 20 mTorr.

In embodiments, where dilution is not provided, the partial pressure of the etchant gas may be of about 200 mTorr.

Figure 4:
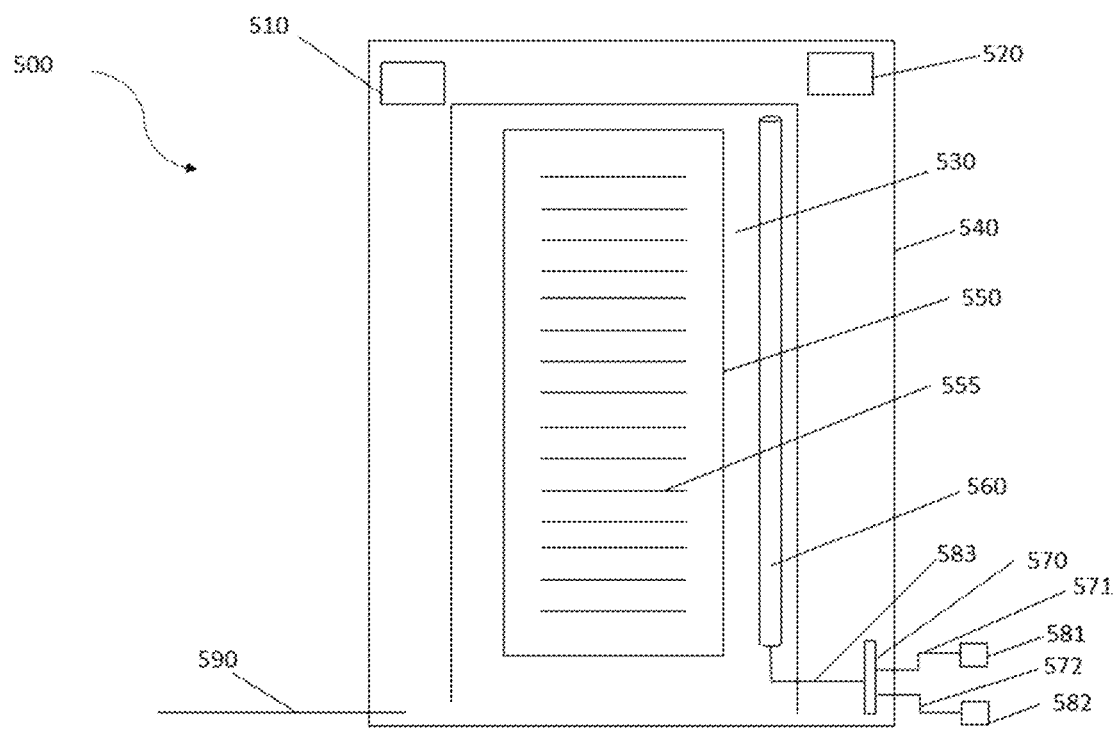
FIG. 4: shows a schematic representation of a wafer processing furnace according to embodiments of the second aspect of the present disclosure.

FIG. 4 shows a schematic representation of a wafer processing furnace (500) according to embodiments of the second aspect of the present disclosure.

The wafer processing furnace (500) may be configured to form an epitaxial stack (200) of semiconductor epitaxial layers (20,30) on a plurality of substrates (550) according to embodiments of the first aspect of the present disclosure.

The wafer processing furnace (500) may comprise a process chamber (530) extending in a vertical direction. The process chamber may have an outer enclosure (540). The wafer processing furnace (500) may comprise a wafer boat (550) for holding a plurality of substrates (555). The plurality of substrates may be spaced apart vertically. The wafer processing furnace (500) may comprise a heater (520) configured to heat the process chamber (530). It may further comprise a silane precursor storage module (581). This silane precursor storage module (581) may comprise at least one of a trisilane precursor, a mono silane precursor, a disilane precursor, a tetra silane precursor, a cyclohexasilane and a neopentasilane precursor. It may also comprise a germane precursor storage module (582). This germane precursor storage module (582) may comprise at least one of a mono germane precursor and a germanium tetrachloride precursor. The wafer processing furnace (500) may further comprise a gas providing manifold (570) operationally connected to the silane precursor storage module (581) and to the germane precursor storage module (582). This gas providing manifold (570) may further be connected operationally to a gas injector (560) being arranged for injecting the one or more silane precursors or the one or more germane precursors. The silane precursor storage module (581) may be connected to the manifold (570) through the gas supply line (571) The germane precursors storage module (582) may be connected to the manifold (570) through the gas supply line (572).

In embodiments, the wafer processing furnace may further comprise an outlet (590), configured for letting an exhaust gas out of the process chamber (530), after processing is completed in the process chamber (530).

It may be an advantage that this wafer processing furnace allows for forming an epitaxial stack on a plurality of substrates as it may help to increase throughput of wafer processing. Due to the fact that plurality of substrates can be processed in one and the same process run and in one and the same process chamber, this wafer processing furnace may provide the advantage of reducing cost of semiconductor processing.

Furthermore, it may provide the advantage of forming a thicker epitaxial stack (200) on the plurality of substrates, whereby the plurality of substrates can benefit from reduced stress relaxation as this wafer processing furnace can provide for epitaxial stack formation at lower temperatures. Furthermore, it may provide the advantage of minimizing uniformity issues such as, for example, thickness uniformity across the surface of the substrate, while providing the advantage of depositing thicker epitaxial stacks. This may therefore, lead to improved success.

In embodiments, the gas injector (560) may comprise a plurality of gas injection holes (not shown in the figure) being vertically spaced apart from one another. The gas injector may further comprise injector tubes (583) for supplying the precursors. The flow rate of each of the precursor gases flowing through the injector tubes may be adjusted such that their partial pressure inside the process chamber can be tuned. This may then allow for adjusting the concentration of each of the precursor gases in the process chamber, thereby further allowing for determining the growth rate of the different epitaxial layers.

The plurality of gas injection holes may provide the advantage of distributing the precursors in the process chamber (530). In embodiments, where the wafer processing furnace is a vertical furnace, the gas injection holes may then, be placed vertically spaced apart from one another. The wafer processing furnace (500) may have an open liner or a closed liner.

In embodiments, the wafer processing furnace (500) may further comprise a controller (510) configured for letting the wafer processing furnace to execute a method as described herein.

Thus, in embodiments, the controller (510) may be configured for enabling the wafer processing furnace (500) to provide the trisilane precursor or the mono silane precursor to the process chamber (530) and to provide the mono germane or germanium tetrachloride precursor, thereby forming a first epitaxial layer (20). The controller (510) may further be configured for enabling the wafer processing furnace (500) to provide the trisilane precursor, thereby forming a second epitaxial layer (30) on the first epitaxial layer (20). The formation of the second epitaxial layer (30) on the first epitaxial layer (20) leads to the formation of the epitaxial pair (50). Repetition of the formation of the epitaxial pairs (50) a plurality of times thus, leads to the formation of the epitaxial stack (200).

In embodiments, the controller (510) may be configured for enabling the wafer processing furnace (500) to provide the cyclohexasilane precursor or the neopentasilane precursor to the process chamber (530) and to provide the mono germane precursor, thereby forming a first epitaxial layer (20). The controller (510) may further be configured for enabling the wafer processing furnace (500) to provide the cyclohexasilane precursor or the neopentasilane precursor, thereby forming a second epitaxial layer (30) on the first epitaxial layer (20). The formation of the second epitaxial layer (30) on the first epitaxial layer (20) leads to the formation of the epitaxial pair (50). Repetition of the formation of the epitaxial pairs (50) a plurality of times thus, leads to the formation of the epitaxial stack (200).

In embodiments, at least one of the first epitaxial layer (20) or the second epitaxial layer (30) may have a thickness in the range of from at least 5 nm to at most 50 nm, or from at least 5 nm to at most 10 nm, or from at least 10 nm to at most 15 nm, or from at least 15 nm to at most 20 nm, or from at least 20 nm to at most 25 nm, or from at least 25 nm to at most 30 nm, or from at least 30 nm to at most 35 nm, or from at least 35 nm to at most 40 nm, or from at least 40 nm to at most 45 nm, or from at least 45 nm to at most 50 nm.

The wafer processing furnace (500) may, in embodiments, further comprise a heater (520) configured for heating the process chamber (530). The heater may provide the advantage of bringing the process chamber (530) to the first deposition temperature or to the second deposition temperature.

In a third aspect, use of trisilane as a semiconductor material precursor is disclosed. The use of trisilane is for forming a Si channel of a 3D DRAM memory device simultaneously on a plurality of substrates comprised in a single process chamber, at a temperature in the range of 300° C. to 550° C.

In some embodiments, the use of trisilane may be done at a temperature in the range of 300° C. to 400° C., or in the range of 400° C. to 500° C., or in the range of 500° C. to 550° C. It may be an advantage that use of trisilane allows for forming the Si channels of 3D DRAM memory devices. This in turn may further be advantageous since it aids the manufacturing of these devices in an effort to cope the drawbacks of the slow-down in scaling in the semiconductor industry. Furthermore, due to the fact that the Si channels can be formed on the plurality of substrates simultaneously may provide the advantage of reducing manufacturing cost of these devices. This may also be advantageous for improving throughput of manufacturing of these devices. It may further be an advantage that thanks to trisilane, Si channels may be formed at a temperature within a lower temperature range, thereby minimizing a probability of stress relaxation. Reduction of the probability of stress relaxation in the channel of a 3D DRAM memory device may offer the advantage of minimizing the adverse effects that may occur on its performance metrics. These performance metrics may include such as, for example, mobility, threshold voltage and leakage current.

In a further aspect use of cyclohexasilane or neopentasilane as a semiconductor material precursor is disclosed. The use of cyclohexasilane or neopentasilane is for forming a Si channel of a 3D DRAM memory device simultaneously on a plurality of substrates comprised in a single process chamber, at a temperature in the range of 400° C. to 450° C. This may provide the advantage of minimizing a probability of stress relaxation in the Si channels as the formation can be carried out at a temperature in the range of 400° C. to 450° C. This may be due to the fact that the growth rate is slower in this temperature. Minimized probability for stress relaxation may be beneficial towards improving the performance metrics of the 3D DRAM memory device such as for example, mobility, threshold voltage and leakage current. Additionally, the simultaneous forming of the Si channels on the plurality of substrates may be advantageous as it improves the throughput of manufacturing. Furthermore, it may further be useful in reducing the manufacturing cost as Si channels can be formed in one and the same process run on the plurality of substrates.

It is to be noted that a method and a wafer processing furnace according to embodiments of the present disclosure may allow for simultaneous processing of a plurality of substrates when forming an epitaxial stack comprising a plurality of epitaxial pairs. This may particularly be suited for semiconductor manufacturing, on one hand in an effort to enable the manufacturing of forthcoming device architectures and, on the other hand for improving throughput of manufacturing and reducing manufacturing costs.

An epitaxial stack, particularly a thicker one, provided on the plurality of substrates according to embodiments of the present disclosure may be beneficial for the manufacturing of 3D DRAM memory devices. Furthermore, an epitaxial stack provided on the plurality of substrates according to embodiments of the present disclosure may be beneficial for the manufacturing of SRAMs or MRAMs that are based on vertical nanowire/nanosheet gate-all-around field effect transistors.

The invention claimed is:

1. A method of forming an epitaxial stack on a plurality of substrates; the method comprising
providing the plurality of substrates to a process chamber;
executing a plurality of deposition cycles, thereby forming the epitaxial stack on the plurality of substrates, the epitaxial stack comprising a plurality of epitaxial pairs, wherein the epitaxial pairs each comprise a first epitaxial layer and a second epitaxial layer, the second epitaxial layer being different from the first epitaxial layer, wherein a deposition cycle comprises:
a first deposition pulse comprising a provision of a first reaction gas mixture to the process chamber, thereby forming the first epitaxial layer; and
a second deposition pulse comprising a provision of a second reaction gas mixture to the process chamber, the second reaction gas mixture being different from the first reaction gas mixture, thereby forming the second epitaxial layer, wherein the first deposition pulse is carried out at a first deposition temperature;

wherein the second deposition pulse is carried out at a second deposition temperature;

wherein the first deposition temperature is different from the second deposition temperature by at most 50° C.; and wherein the forming of the first epitaxial layer comprises forming the first epitaxial layer on both sides of the plurality of substrates.

2. The method according to claim 1, wherein:

the first epitaxial layer comprises a first semiconductor material;

the provision of the first reaction gas mixture comprises providing first semiconductor material precursors;

the second epitaxial layer comprises a second semiconductor material being different than the first semiconductor material; and the provision of the second reaction gas mixture comprises providing a second semiconductor material precursor.

3. The method according to claim 2, wherein the first semiconductor material precursors comprise a germanium-containing compound and a first silicon-containing compound; and wherein the second semiconductor material precursor comprises substantially a second silicon-containing compound.

4. The method according to claim 3, wherein the germanium-containing compound comprised in the first semiconductor material precursors is at least one of GeH4 and GeCl4.

5. The method according to claim 3, wherein the second silicon-containing compound comprised substantially in the second semiconductor material precursor is trisilane.

6. The method according to claim 5, wherein the first silicon-containing compound comprised in the first semiconductor material precursors is trisilane.

7. The method according to claim 3, wherein the first silicon-containing compound comprised in the first semiconductor material precursors is a cyclic silane or a high order branched silane; and wherein the germanium-containing compound comprised in the first semiconductor material precursors is GeH4.

8. The method according to claim 7, wherein the cyclic silane is cyclohexasilane.

9. The method according to claim 7, wherein the high order branched silane is neopentasilane.

10. The method according to claim 1, wherein both the first and the second deposition temperature is at a temperature in a range of 300° C.° to 550° C.

11. The method according to claim 5, wherein the first silicon-containing compound is provided in a continuous flow; and wherein the germanium-containing compound is provided intermittently.

12. The method according to claim 5, wherein the germanium-containing compound comprised in the first semiconductor material precursors is GeH4; and wherein the first silicon-containing compound comprised in the first semiconductor material precursors is mono silane.

13. The method according to claim 1, wherein the method further comprises, before executing the plurality of deposition cycles, performing a pre-cleaning step, the pre-cleaning step comprising subjecting both the sides of the plurality of substrates to an ambient comprising a fluorine-containing compound.

14. The method according to claim 13, further comprising subjecting the plurality of substrates to a Cl comprising ambient at a temperature in a range of 400° C.-600° C. after subjecting both the sides of the plurality of substrates to the ambient comprising the fluorine-containing compound.

15. The method according to claim 1, wherein at least one of the first reaction gas mixture and the second reaction gas mixture comprises an etchant gas.

16. The method according to claim 1, wherein the process chamber is comprised in a vertical furnace.

* * * * *